United States Patent [19]
Huang et al.

[11] Patent Number: 5,959,361
[45] Date of Patent: Sep. 28, 1999

[54] DIELECTRIC PATTERN

[75] Inventors: Yimin Huang, Taichung Hsien; Tri-Rung Yew, Hsinchu Hsien, both of Taiwan

[73] Assignee: United Microelectronics Corp., Hsin-Chu, Taiwan

[21] Appl. No.: 09/059,691

[22] Filed: Apr. 14, 1998

[30] Foreign Application Priority Data

Dec. 3, 1997 [TW] Taiwan ................................. 86118145

[51] Int. Cl.⁶ .......................... H01L 29/28; H01L 21/321
[52] U.S. Cl. .......................... 257/774; 257/759; 257/760; 257/642
[58] Field of Search ..................................... 257/635, 691, 257/758, 759, 760, 774, 752, 751, 642

[56] References Cited

U.S. PATENT DOCUMENTS

| | | | |
|---|---|---|---|
| 5,479,054 | 12/1995 | Tottori | 257/752 |
| 5,585,673 | 12/1996 | Joshi et al. | 257/751 |
| 5,616,959 | 4/1997 | Jeng | 257/752 |
| 5,625,231 | 4/1997 | Huang et al. | 257/751 |
| 5,763,954 | 6/1998 | Hyakutake | 257/752 |

*Primary Examiner*—Peter Toby Brown
*Assistant Examiner*—Hung Van Duong
*Attorney, Agent, or Firm*—Christie, Parker & Hale, LLP

[57] ABSTRACT

A dielectric pattern. On a substrate having a metal wiring layer formed thereon, a first dielectric layer and a first masking layer are formed. A cap insulation layer is formed on the masking layer. The first dielectric layer, the first masking layer and the cap insulation layer are penetrated through by a first opening. A second dielectric layer and a second masking layer are formed on the cap insulation layer. The second dielectric layer and the second masking layer are penetrated through by a second opening. The first and the second openings are contiguous without intermittence.

6 Claims, 7 Drawing Sheets

DIELECTRIC PATTERN

CROSS-REFERENCE TO RELATED APPLICATION

This application claims priority benefit of Taiwan application Serial no. 86118145, filed Dec. 3, 1997, the full disclosure of which is incorporated herein by reference.

BACKGROUND OF THE INVENTION

1. Field of the Invention

The invention relates to a pattern of a dielectric layer, and more particularly to a method of patterning a dielectric layer with a low dielectric constatnt k.

2. Description of the Related Art

In the semiconductor fabrication process, as the dimension of devices on a chip becomes smaller and smaller, the density of interconnect pitch is higher and higher. For a common dielectric layer, for example, a silicon oxide layer, due to the high dielectric constant, a higher RC delay is easily caused. Therefore, this kind of dielectric layer is not used as an inter-metal dielectric (IMD) in a high speed IC any longer. To apply a low k dielectric layer has the advantage such as reducing the interconnection parasitic capacitance, consequently reducing the RC delay, or mitigating the cross talk between metal lines, hence, the operation speed is improved. Hence, the low k dielectric layer is a very popular IMD material used in a high speed IC.

A common low k dielectric layer comprises organic polymers, for example, flare and parylene which are very suitable for used as an IMD.

FIG. 1A to FIG. 1D show the process of fabricating metal interconnects. Over a substrate 10 having a metal wiring layer 11 formed thereon, a dielectric layer 12 is formed, for example, using chemical vapour deposition (CVD) or spin-on-glass (SOG) to deposit organic polymer with a thickness of about 3000 Å to 10000 Å. An insulation masking layer 13 such as a silicon oxide layer is formed on the dielectric layer 12 as a hard mask for the subsequent etching process. The insulation masking layer 13 is formed, for example, by CVD with silane ($SiH_4$) and oxygen, and tetra-ethyl-oxy-silicate (TEOS) as reacting gas. Using photolithography, a photo-resist layer 14 is formed and patterned on the insulation masking layer 13.

Referring to FIG. 1B, using the photo-resist layer 14 as a mask, the insulation 1 0 masking layer 13 and the dielectric layer 12 are etched to form an opening 12 and to expose the metal wiring layer 11.

Referring to FIG. 1C, using a plasma containing oxygen as a cleaning agent, the photo-resist layer 14 is removed. Similar to the material contained in the photo-resist layer 14, the material contained in the dielectric layer 12 has a large proportion of carbon. Thus, part of the dielectric layer 12 is removed while removing the photo-resist layer 14.

Referring to FIG. 1D, after removing the photo-resist layer, a bowing side wall 16 is formed within the opening 15. In the subsequent process for forming conductive material, the step coverage is affected by the formation of the bowing side wall. Therefore, the stability and reliability of the devices are degraded.

In the he above method, the formation of a low k dielectric layer 12 in the process of interconnection has quite a few disadvantages. While removing the photo-resist layer 14, since the dielectric material is very similar to the photo-resist material, for example, both containing a large proportion of carbon, part of the low k dielectric layer 12 within the opening 15 is removed too. A bowing side wall 16 is thus formed within the opening 15. The bowing side wall 16 causes difficulty during the subsequent deposition process, and therefore, a poor step coverage is resulted. The conductivity for interconnects and the stability for devices are degraded. The degradation is more obvious as the dimension of and distances between devices becomes smaller and smaller.

SUMMARY OF THE INVENTION

It is therefore an object of the invention to provide a method patterning a dielectric layer. The disadvantage of easily etched by plasma containing oxygen is improved. Therefore, it is more advantageous for the fabrication of interconnects.

To achieve these objects and advantages, and in accordance with the purpose of the invention, as embodied and broadly described herein, the invention is directed towards a dielectric pattern. On a substrate having a metal wiring layer formed thereon, a first dielectric layer and a first masking layer are formed. A cap insulation layer is formed on the masking layer. The first dielectric layer, the first masking layer and the cap insulation layer are penetrated through by a first opening. A second dielectric layer and a second masking layer are formed on the cap insulation layer. The second dielectric layer and the second masking layer are penetrated through by a second opening. The first and the second openings are contiguous without intermittence.

It is to be understood that both the foregoing general description and the following detailed description are exemplary and explanatory only and are not restrictive of the invention, as claimed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

In the invention, with the addition of a cap insulation layer 24, the plasma containing oxygen is blocked, and the removal of the low k dielectric layer by the plasma is prevented. In addition, three step etching process is in use in the invention, therefore, the cap insulation layer is removed completely afterwards without increasing the resistance of metal wiring layer, and the RC delay time is not increased thereby.

Figure 1A:
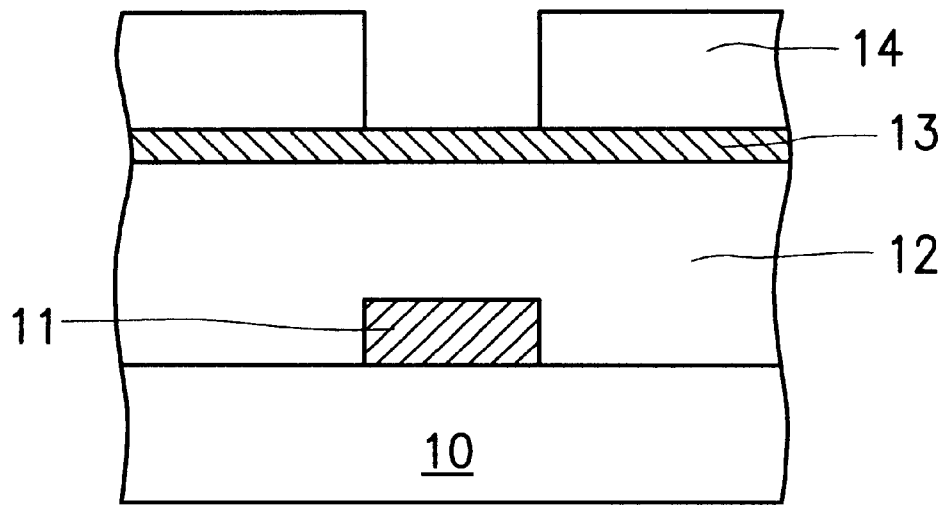
FIG. 1A to FIG. 1D are cross sectional views of the conventional process for fabricating an interconnects.
Figure 1B:
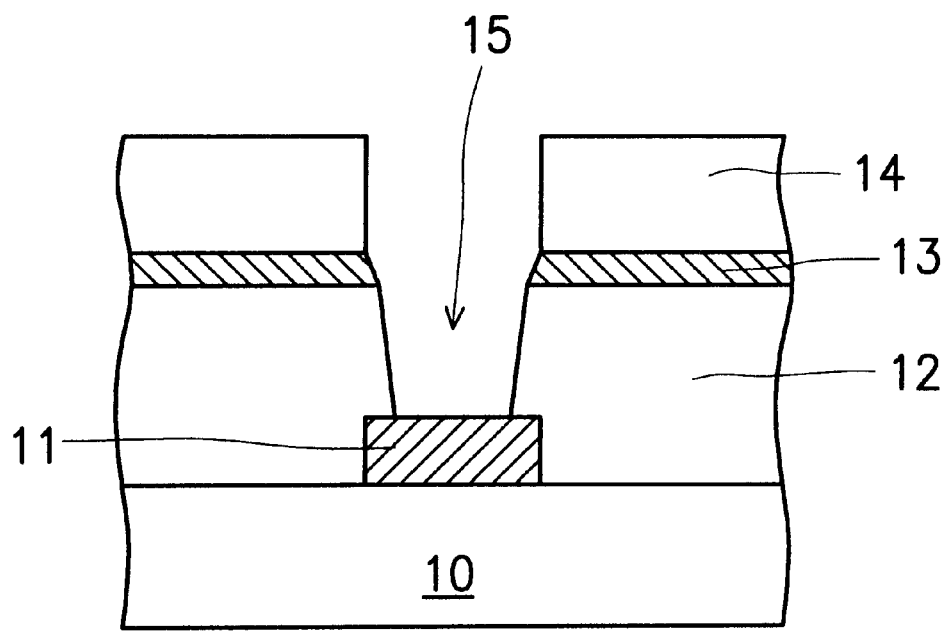
Figure 1C:
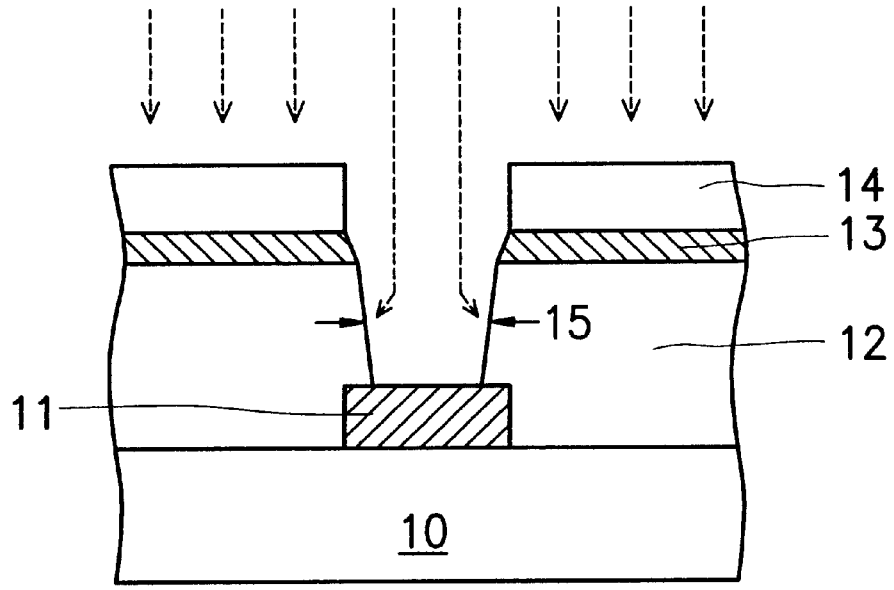
Figure 1D:
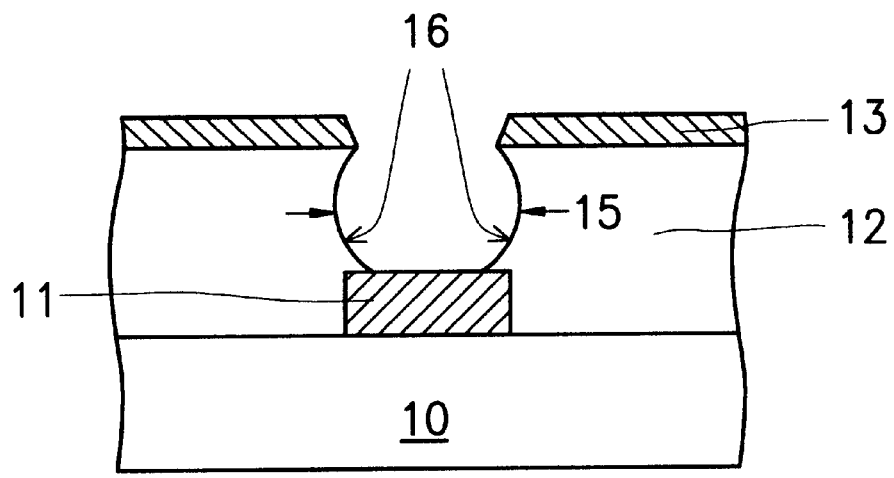
Figure 2A:
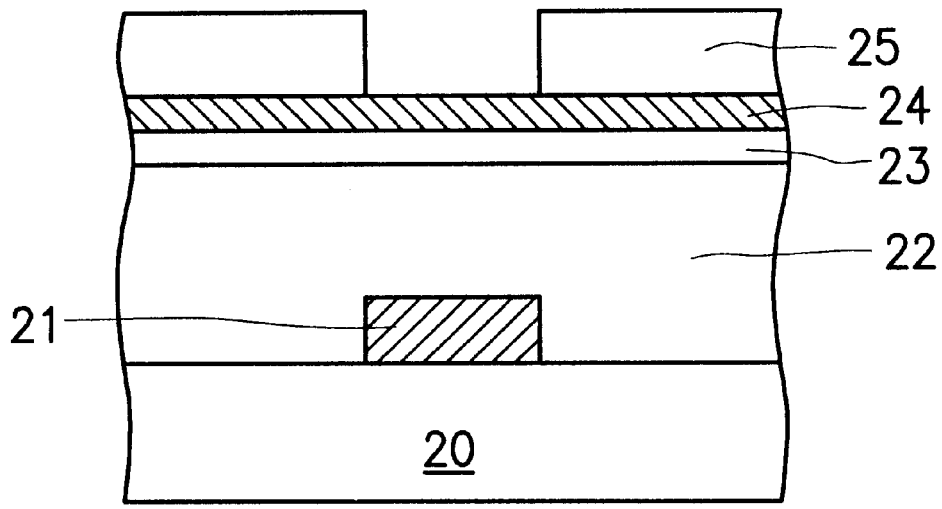
FIG. 2A to FIG. 2E are cross sectional views of the process for patterning a dielectric layer in a preferred embodiment according to the invention.

Referring to FIG. 2A, on a semiconductor substrate 20 having a metal wiring layer 21 formed thereon, a dielectric layer 22 is formed. The dielectric layer 22 is a low k dielectric layer, for example, an organic polymer formed by CVD or SOG with a thickness of about 5000 Å to 10000 Å. Preferably, the dielectric layer 22 is planarized, for example, by etch back or chemical-mechanical polishing (CMP). The thickness of the dielectric layer after planarization is adjustable, depending on the structure formed on the substrate 20. An insulation masking layer 23, for example, a silicon oxide layer, is formed on the dielectric layer 22 as a hard mask for the subsequent etching process. The insulation masking layer 23 is formed, for example, by CVD and using silane and oxygen, or tetra-ethyl-oxy-silicate (TEOS) as reacting gas. A cap insulation layer 24, preferably a silicon nitride layer, is formed on the insulation masking layer 22. The formation of the cap insulation layer 24 is the characteristic of the invention. With the cap insulation 24, the dielectric layer is protected from being etched by plasma containing oxygen during the subsequent process. A photo-resist layer 25 is formed and patterned on the cap insulation layer.

Figure 2B:
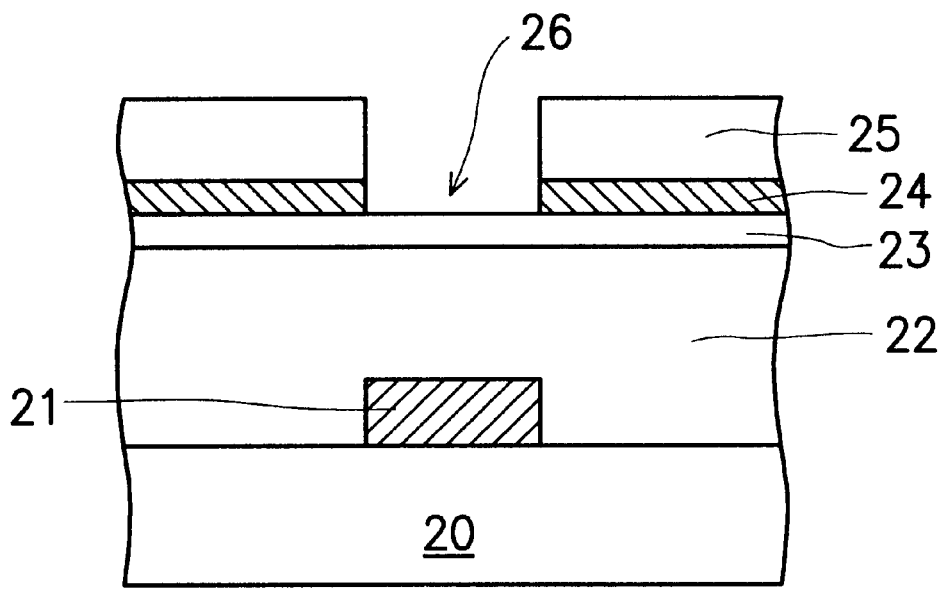

Referring FIG. 2B, using the photo-resist layer as a mask, the cap insulation layer 24 is etched to form an opening 26 and expose the insulation masking layer 23.

Figure 2C:
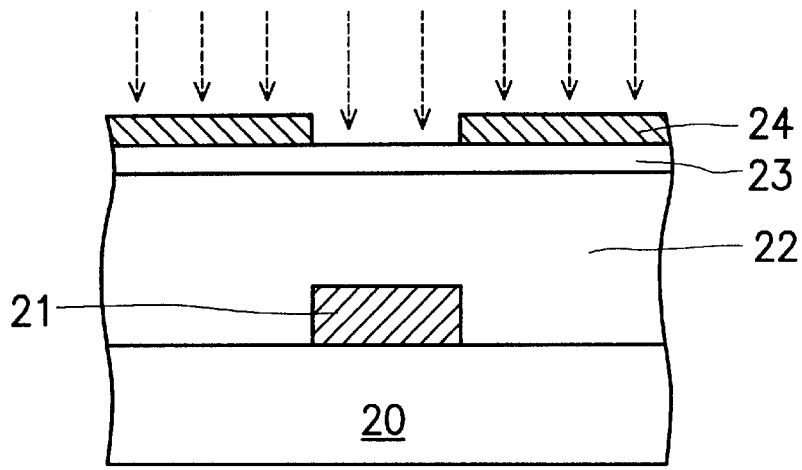

Referring to FIG. 2C, using plasma containing oxygen as a clean agent, the photo-resist layer 25 is removed. The dielectric layer 22 is not etched being covered and protected by the cap insulation layer 24 and the insulation masking layer 23. The thickness of the cap insulation layer 24 is adjusted appropriately, for example, 300 Å to 1000 Å, so as to be etched away completely during the subsequent process for etching the insulation masking layer 23.

Figure 2D:
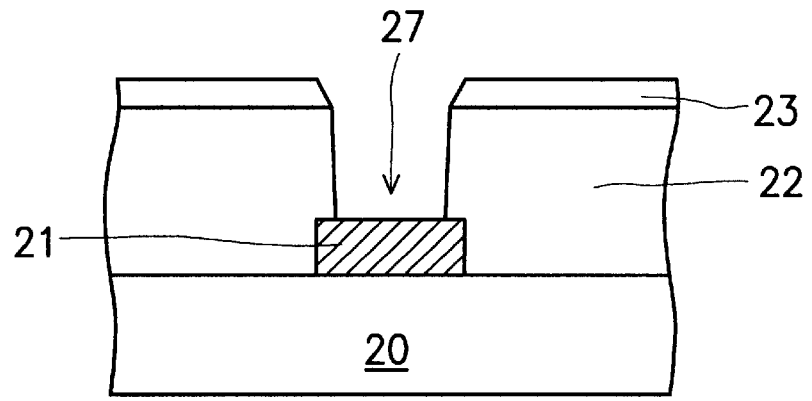

Referring to FIG. 2D, using the cap insulation layer 24 as a mask, an anisotropic etching is performed to remove the insulation masking layer 23 and the dielectric layer 22 until exposing the metal wiring layer 21.

Figure 2E:
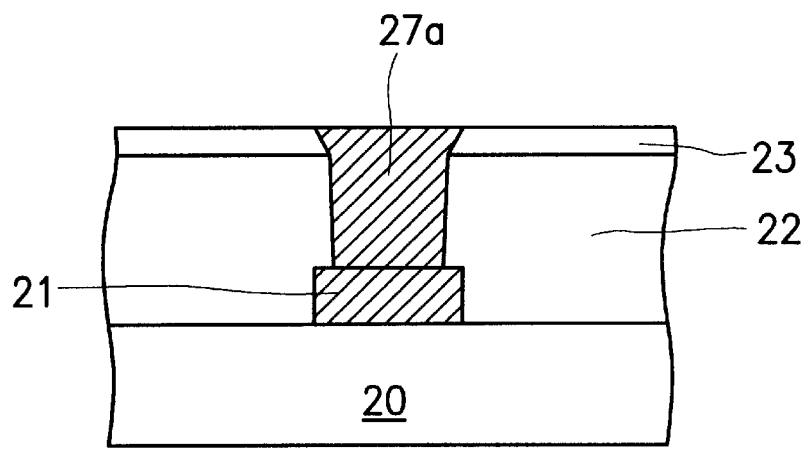

Referring to FIG. 2E, a conductive layer 27a is formed to fill the opening 27. The conductive layer 27a includes aluminium or other metals formed by sputtering or CVD. The conductive layer 27a is planarized by CMP to form a plug within the opening 27.

Another embodiment using for dual damascence process according to the invention is represented with the reference of FIG. 3A to FIG. 3H as follows.

Figure 3A:
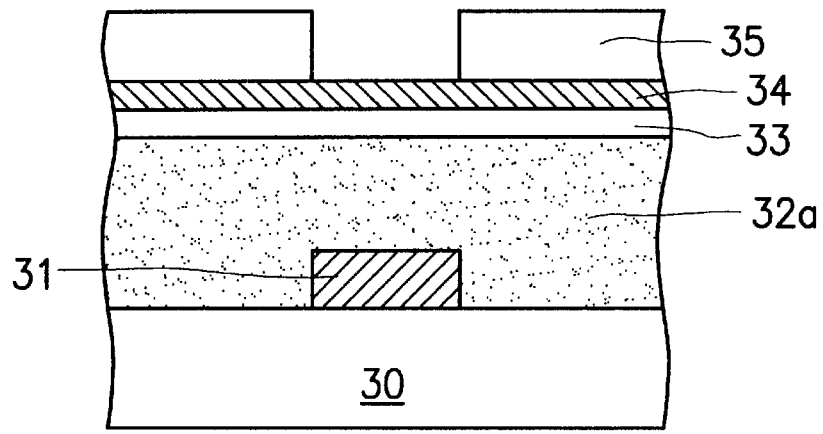
FIG. 3A to FIG. 3H are cross sectional views of the process of patterning a dielectric layer to form a dual damascence structure in another preferred embodiment according to the invention.

Referring to FIG. 3A, on a semiconductor 30 having a metal wiring layer 31 form thereon, a first dielectric layer 32a is formed. The material of the first dielectric layer 32a includes low k dielectric such as organic polymer with a thickness about 5000 Å to 10000 Å. The practical thickness of the first dielectric layer 32a is adjustable, depending on the structure of the metal wiring layer 31. On the first dielectric layer 32a, a first insulation masking layer 33 such as a silicon oxide layer, is formed, for example, by CVD and using silane and oxygen, or TEOS as reacting gas. A first cap insulation layer 34, preferably, a silicon nitride layer, is formed on the first insulation masking layer 33. The formation of the first cap insulation layer 34 is the characteristic of the invention. With the first cap insulation layer 34, the first dielectric layer 32a is protected from being etched by plasma containing oxygen during the subsequent process. A photo-resist layer 35 is formed and patterned on the first cap insulation layer 34.

Figure 3B:
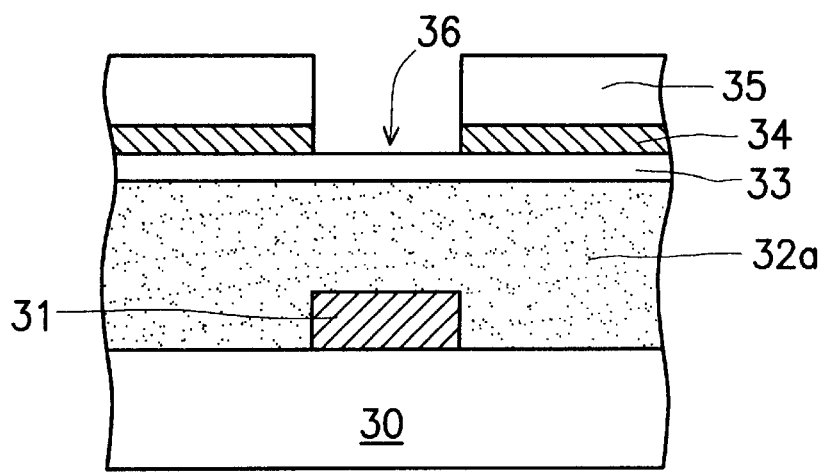

Referring to FIG. 3B, using the photo-resist layer 35 as a mask, an opening 36 is formed and the first insulation masking layer 33 is exposed by etching the first cap insulation layer 34. The first cap insulation layer 34 is thick enough to perform as a mask while etching the underlying first insulation masking layer 33. Therefore, the thickness of the first cap insulation layer 34 is about 300 Å to 1000 Å.

Figure 3C:
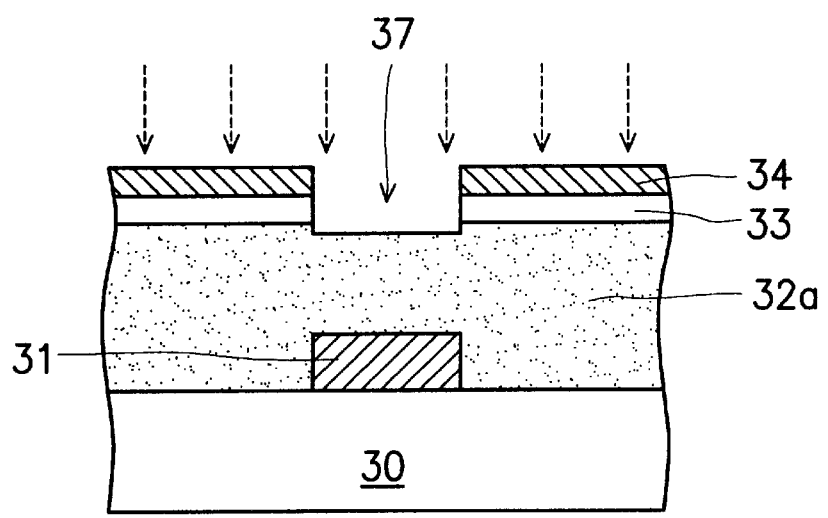

Referring to FIG. 3C, using plasma containing oxygen as a cleaning agent. Being covered by the first cap insulation layer 34 and the first insulation masking layer 33, the first dielectric layer 32a protected from being etched by the plasma with oxygen. Using the first cap insulation layer 34 as a mask, an opening 37 is formed by aniostropically etching the first insulation masking layer 32b, so that the first dielectric layer 32a is exposed within the opening 37.

Figure 3D:
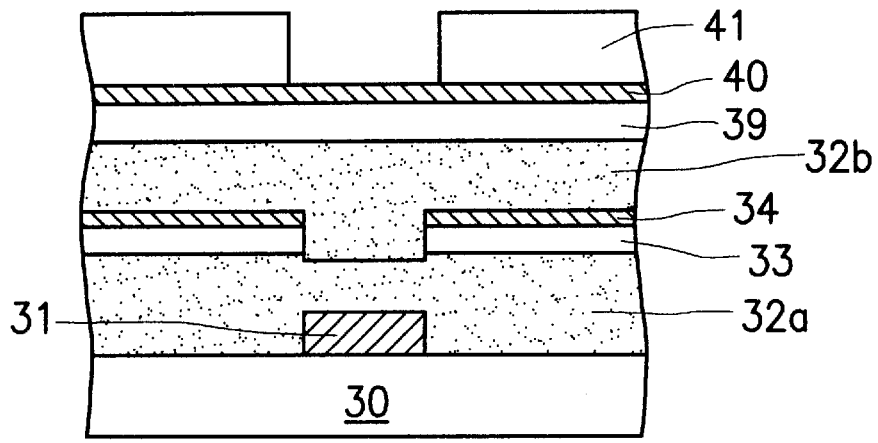

Referring to FIG. 3D, on the first cap insulation layer 34 and the opening 37, a second dielectric layer 32b is formed. The second dielectric layer 32b is, for example, an organic polymer with a thickness of about 5000 Å to 8000 Å. On the second dielectric layer 32b, a second insulation masking layer 39 such as a silicon oxide layer formed by CVD is formed. A second cap oxide layer 40 is formed on the insulation masking layer 39. A photo-resist layer 41 is formed and patterned on the second insulation masking layer 39.

Figure 3E:
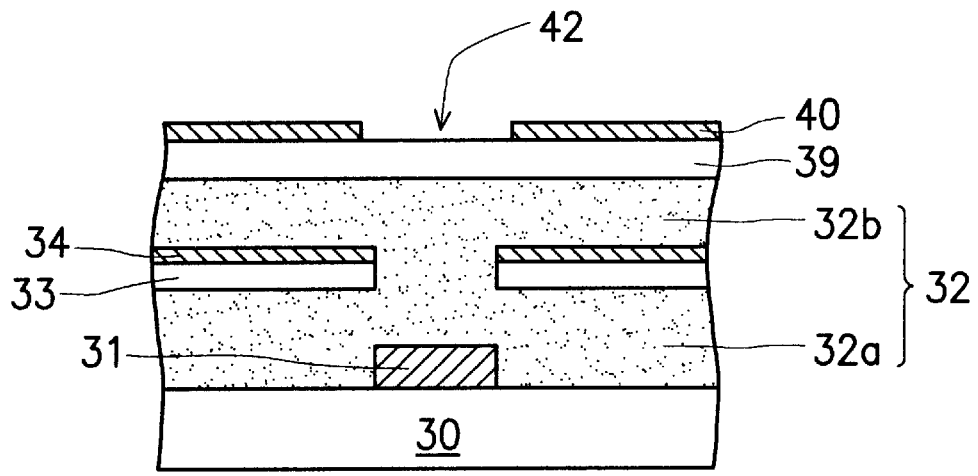

Referring to FIG. 3E, using the photo-resist layer 41 as a mask, the second cap insulation layer 40 is etched to form an opening 42, and the second insulation masking layer 39 within the opening 42 is exposed. An appropriate thickness of the second cap insulation layer 40 is about 300 Å to 1000 Å. The first dielectric layer 32a and the second dielectric layer is assembled as a dielectric layer 32.

Figure 3F:
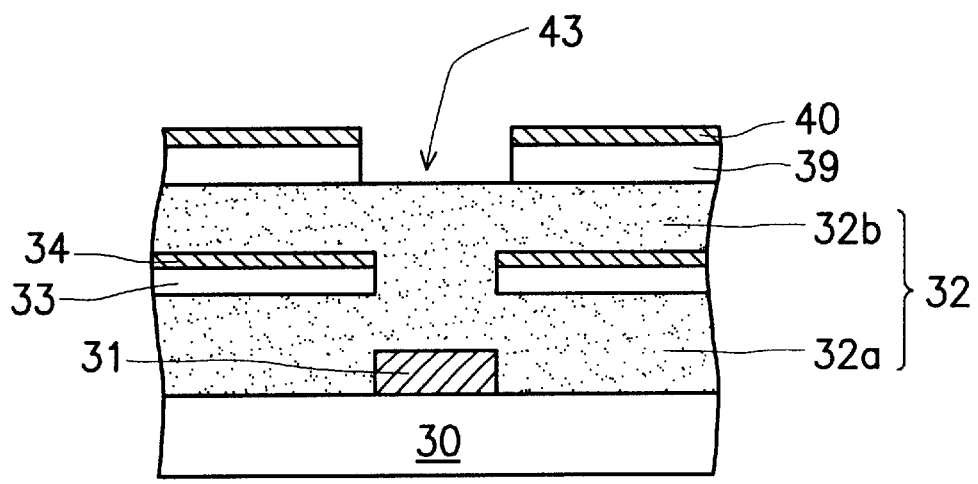

Referring to FIG. 3F, using the second cap insulation layer 40 as a mask, the insulation masking layer is anisotropically etched to form an opening 43, so that the second dielectric layer 32b is exposed within the opening 43.

Figure 3G:
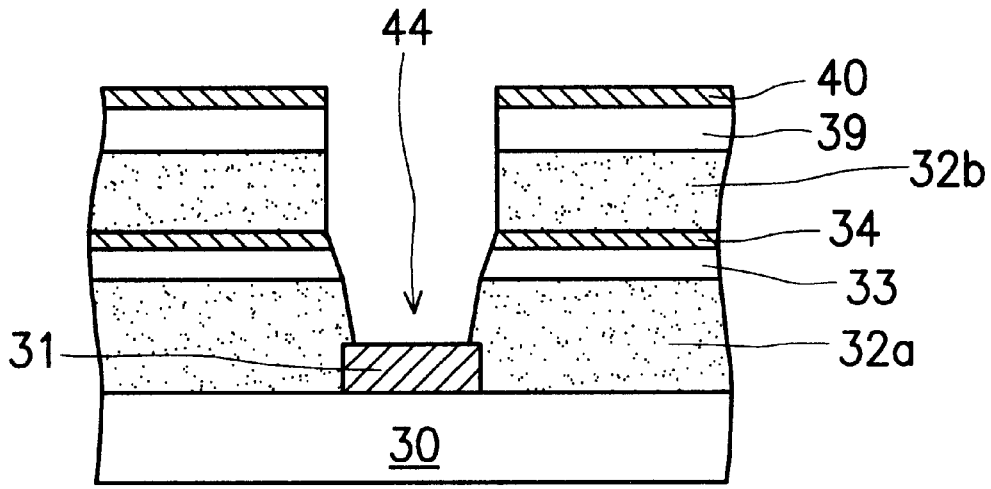

Referring to FIG. 3G, using anisotropic etching, the second dielectric layer 32b and the first dielectric layer 32a, that is, the dielectric layer 32 within the opening, until the metal wiring layer 3 1 is exposed.

Figure 3H:
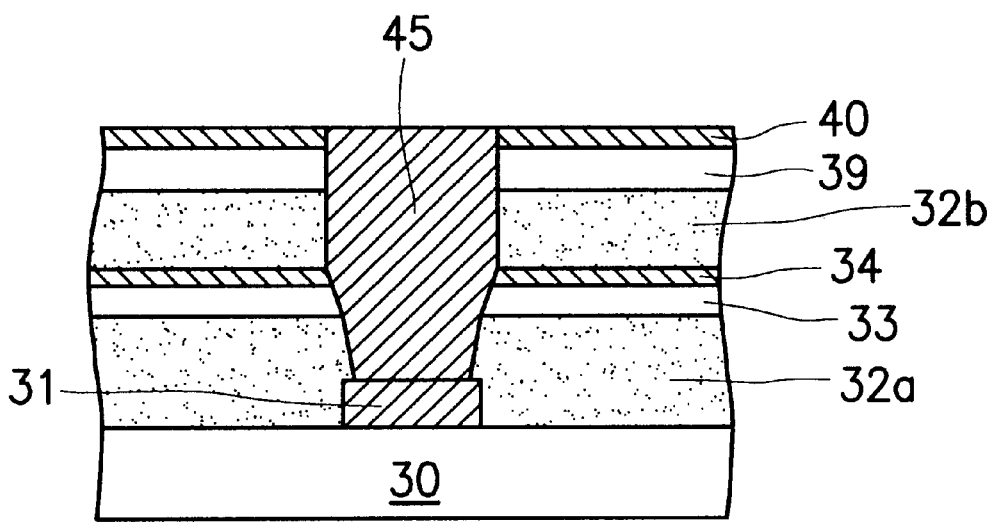

Referring to FIG. 3H, a conductive layer 45 is formed, for example, by sputtering or CVD over the substrate 30. The conductive layer 45 includes aluminium or other metals. The conductive layer 45 is planarized to form a plug within the opening 43 for interconnection.

The advantages of the invention are:

(1) With the additional cap insulation layer to define an opening, during the process for removing the photo-resist layer, the low k dielectric layer is covered and protected by the cap insulation layer and the insulation masking layer from being etched by the plasma containing oxygen.

(2) After the formation of an opening within the cap insulation layer, the insulation masking layer is etched by using the cap insulation layer as a mask. The thickness of the cap insulation layer is adjustable, so that the cap insulation layer is etched together with the insulation masking layer. Therefore, the RC delay time is not increased by the residue of the cap insulation layer.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A dielectric pattern, comprising:

a substrate;

a metal wiring layer, formed on the substrate;

a first dielectric layer, comprising low k organic materials with a thickness of about 5000–10000 Å, formed on the metal wiring layer and the substrate;

a first masking layer and a cap insulation layer, formed on the first dielectric layer in sequence, wherein the first dielectric layer, the first masking layer and the cap insulation layer are penetrated through by an opening, so that the metal wiring is exposed within the opening;

a second dielectric layer comprising low k organic materials with a thickness of about 5000–10000 Å, formed on the cap insulation layer; and a second masking layer, formed on the second dielectric layer, wherein the second dielectric layer and the second masking layer are penetrated through by a second opening, and the second opening and the first opening are contiguous without intermittence.

2. The dielectric pattern according to claim 1, wherein the first masking layer includes silicon oxide.

3. The dielectric pattern according to claim 1, wherein the second masking layer includes silicon oxide.

4. The dielectric pattern according to claim 1, wherein the cap insulation layer includes silicon nitride.

5. A dielectric pattern, comprising:

a substrate;

a metal wiring layer, formed on the substrate;

a first dielectric layer, including xylene plastic, formed on the metal wiring layer and the substrate;

a first masking layer and a cap insulation layer, formed on the first dielectric layer in sequence, wherein the first dielectric layer, the first masking layer and the cap insulation layer are penetrated through by an opening, so that the metal wiring is exposed within the opening;

a second dielectric layer, formed on the cap insulation; and a second masking layer, formed on the second dielectric layer, wherein the second dielectric layer and the second masking layer are penetrated through by a second opening, and the second opening and the first opening are contiguous without intermittence.

6. A dielectric pattern, comprising:

a substrate;

a metal wiring layer, formed on the substrate;

a first dielectric layer, formed on the metal wiring layer and the substrate;

a first masking layer and a cap insulation layer, formed on the first dielectric layer in sequence, wherein the first dielectric layer, the first masking layer and the cap insulation layer are penetrated through by an opening, so that the metal wiring is exposed within the opening;

a second dielectric layer, including xylene plastic, formed on the cap insulation; and a second masking layer, formed on the second dielectric layer, wherein the second dielectric layer and the second masking layer are penetrated through by a second opening, and the second opening and the first opening are contiguous without intermittence.

* * * * *